United States Patent
Jain et al.

(10) Patent No.: US 11,462,294 B2
(45) Date of Patent: Oct. 4, 2022

(54) MISSION MODE VMIN PREDICTION AND CALIBRATION

(71) Applicant: Advanced Micro Devices, Inc., Santa Clara, CA (US)

(72) Inventors: Ashish Jain, Austin, TX (US); Sriram Sundaram, Austin, TX (US); Samuel Naffziger, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/121,110

(22) Filed: Dec. 14, 2020

(65) Prior Publication Data
US 2022/0189576 A1    Jun. 16, 2022

(51) Int. Cl.
    G11C 7/10        (2006.01)
    G11C 29/50       (2006.01)
    G11C 7/22        (2006.01)
    H03K 3/03        (2006.01)

(52) U.S. Cl.
    CPC ........ G11C 29/50012 (2013.01); G11C 7/222 (2013.01); H03K 3/0315 (2013.01)

(58) Field of Classification Search
    CPC . G11C 29/50012; G11C 7/222; H03K 3/0315
    See application file for complete search history.

(56) References Cited

U.S. PATENT DOCUMENTS 7,872,930 B2    1/2011  Chen et al.
9,672,310 B1 *  6/2017  Oliva ................ G01R 31/2879
2014/0176116 A1* 6/2014 Kumar .................... G06F 1/324
                                                  327/564
2015/0081039 A1   3/2015  Allen-Ware
2015/0277393 A1  10/2015  Liu et al.
2015/0325307 A1  11/2015  Chan et al.

FOREIGN PATENT DOCUMENTS

KR    10-1214022 B1    12/2012

OTHER PUBLICATIONS

International Search Report and Written Opinion for International Application No. PCT/US2021/061800, dated Mar. 22, 2022, 7 pages.

* cited by examiner

*Primary Examiner* — Xiaochun L Chen
(74) *Attorney, Agent, or Firm* — Polansky & Associates, P.L.L.C.; Paul J. Polansky; Nathan H. Calvert

(57) ABSTRACT

The low end operating voltage of an integrated circuit is adjusted. Oscillations are counted at a ring oscillator on the integrated circuit over a designated period of clock cycles. Based on the number of oscillations, a prediction model associated with a first set of device degradation data and a second set of static random-access memory (SRAM) low end operating voltage data is used to select a low end operating voltage limit for a processor on the integrated circuit. The low end operating voltage of the processor is set based on the selected low end operating voltage limit. These steps are repeated multiple times during operation of the processor. A method of testing integrated circuits to provide the data employed to produce the prediction model is also provided.

23 Claims, 5 Drawing Sheets

MISSION MODE VMIN PREDICTION AND CALIBRATION

BACKGROUND

The lowest power supply voltage at which semiconductor devices can reliably operate, typically referred to as "Vmin", is an important parameter for considerations such as power efficiency and battery life. After a semiconductor part such as a processor chip is deployed, Vmin slowly increases over the part's operational lifetime as the part gets stressed during operation because of known effects like HCI (Hot Carrier Injection), BTI (Bias Temperature Instability) and others. This increase means that if the low end operating voltage is set at or near the initial Vmin for the processor chip, the chip will function properly when initially deployed, but will eventually have errors and failures.

A common solution to compensate for the Vmin increase is to configure a semiconductor part to add a guardband to the initial Vmin value when setting the low end operating voltage for the part. The guardband is set to account for the Vmin shift that is expected to occur after a designated period of usage under a known usage scenario. Using this technique means that a fixed, pessimistic guardband is employed on all parts starting from the beginning of usage. While this technique helps ensures good yields and quality metrics such as Defective Parts Per Million (DPPM), it is detrimental for power efficiency related to Vmin-limited operation.

Figure 1:
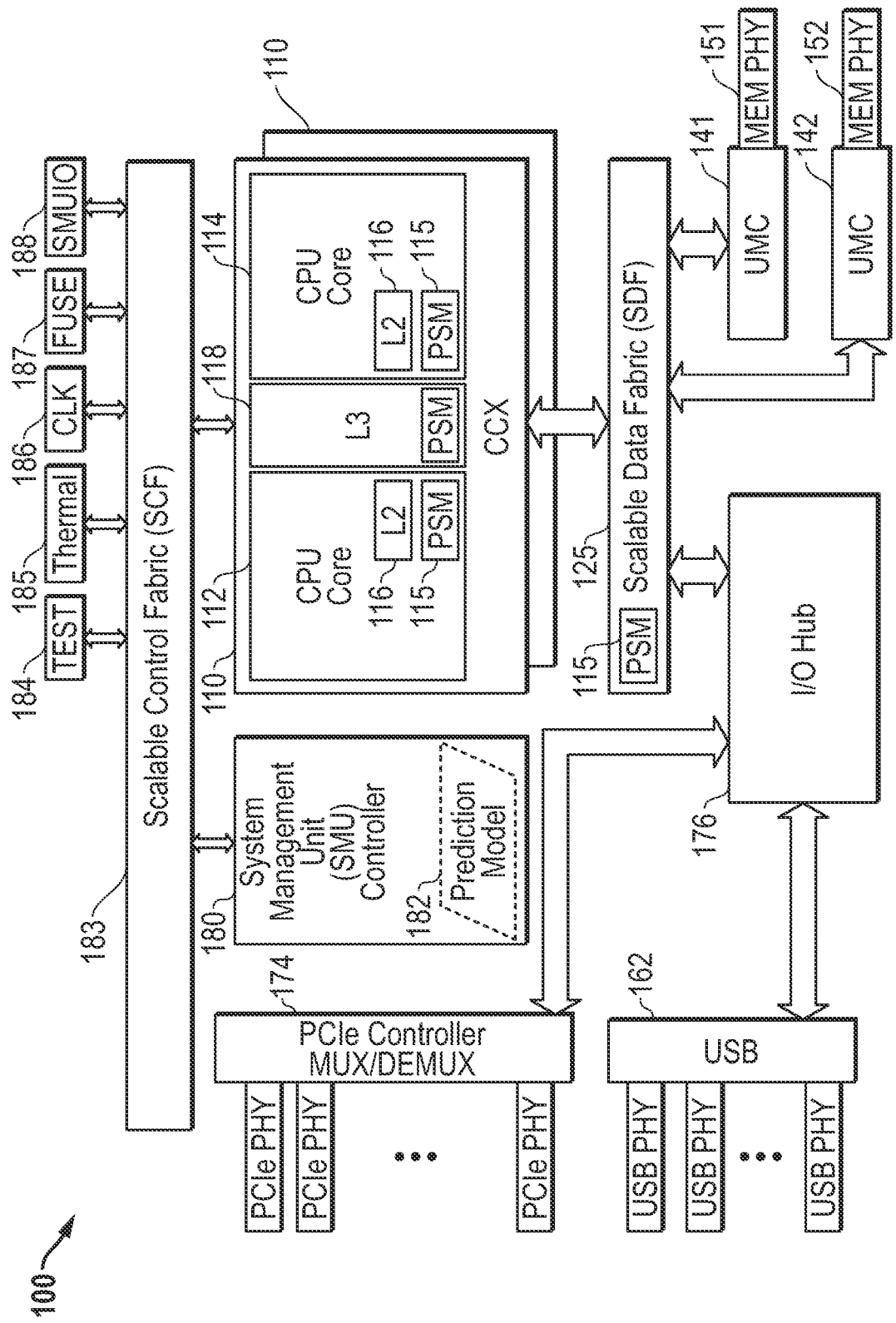
FIG. 1 illustrates in block diagram form an accelerated processing unit according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A method configures a low end operating voltage control process for a target integrated circuit. The method includes performing High Temperature Operating Life (HTOL) stress testing of a set of integrated circuits of the same model as the target integrated circuit and saving a resulting first set of device degradation data. During the HTOL testing, the method measures slow end operating voltages of static random-access memory (SRAM) on the set of integrated circuits during the HTOL stress testing and saving a resulting second set of SRAM low end operating voltage data. A prediction model is produced associated with the first set of device degradation data and the second set of SRAM low end operating voltage data. The method includes deploying the prediction model to a data processing system including the target integrated circuit and configuring the target integrated circuit to (a) count a number of oscillations of at least one ring oscillator on the target integrated circuit over a designated period of clock cycles; (b) based on the number of oscillations, access the prediction model and select from the prediction model a low end operating voltage limit for a processor on the target integrated circuit; (c) set the low end operating voltage of the processor based on the selected low end operating voltage limit and operating the processor at the low end operating voltage; and (d) repeat paragraphs (a)-(c) multiple times during operation of the data processing system.

A method adjusts a low end operating voltage of an integrated circuit. The method includes counting a number of oscillations of at least one ring oscillator on the integrated circuit over a designated period of clock cycles. Based on the number of oscillations, the method accesses a prediction model associated with a first set of device degradation data and a second set of static random-access memory (SRAM) low end operating voltage data, and selects from the prediction model a low end operating voltage limit for a processor on the integrated circuit. The method sets the low end operating voltage of the processor based on the selected low end operating voltage limit. These steps are repeated multiple times during operation of the processor.

An integrated circuit includes a processor core and a system management unit which sets a voltage level on which the processor core operates. The system management unit is operable to adjust a low end operating voltage of the processor core by obtaining a count of oscillations of at least one ring oscillator on the integrated circuit over a designated period of clock cycles. Based on the count, the system management unit accesses a prediction model associated with a first set of device degradation data and a second set of static random-access memory (SRAM) low end operating voltage data, and selects a current low end operating voltage limit for the processor core. It then sets the low end operating voltage of the processor core to the selected low end operating voltage limit. These multiple times during operation of the integrated circuit.

FIG. 1 illustrates in block diagram form an accelerated processing unit (APU) 100. APU 100 is an integrated circuit suitable for use as a processor in a host data processing system, and includes generally a central processing unit (CPU) core complex 110 including CPU cores 112 and 114, a scalable control fabric (SCF) 183, a system management unit controller (SMU) 180, a scalable data fabric 125, and numerous peripheral controllers. As will be appreciated by a person of ordinary skill, APU 100 may not have all of these elements present in every embodiment and, further, may have additional elements included therein. For example, graphics processing units (GPUs) are present in some embodiments, instead of or in addition to the CPU cores. Furthermore, APU 100 may be constructed of one or multiple integrated circuits in a system such as a multi-chip module.

CPU core complex 110 includes a CPU core 112 and a CPU core 114. Multiple CPU core complexes 110 are used. In this example, CPU core complex 110 includes two CPU cores, but in other embodiments CPU core complex 110 can include more CPU cores such as four, eight, or sixteen. Each of CPU cores 112 and 114 is bidirectionally connected to SCF 183 which forms a control fabric, and to SDF 125, and is capable of providing memory access requests and communication through SDF 125. CPU cores 112 and 114 each include a level-two (L2) cache 116, and a power supply monitor (PSM) 115 positioned near the respective L2 cache 116 for monitoring conditions associated with circuit degradation, as further described below. In this embodiment, CPU cores 112 and 114 share certain resources of CPU core complex 110 such as the depicted level-three (L3) cache 118. L3 cache 118 also includes a PSM 115 for monitoring circuit degradation conditions. In this embodiment, PSMs 115 are positioned near static random-access memory (SRAM) structures such as the depicted caches because SRAM memory is often more sensitive to long-term degradation than many other portions of the circuit. However, PSMs 115 can also be placed in other locations in other embodiments.

SDF 125 includes a crossbar switch for routing memory access requests and memory responses between any memory accessing agent and universal memory controllers (UMCs) 141 and 142. SDF 125 also includes a system memory map, defined by basic input/output system (BIOS), for determining destinations of memory accesses based on the system configuration, as well as buffers for each virtual connection. Because the buffers in this embodiment are constructed with SRAM memory, a PSM 115 is included near the buffers to monitor circuit degradation.

SMU 180 is a local controller that controls the operation of the resources on APU 100 and synchronizes communication among them. SMU 180 manages power-up sequencing of the various processors on APU 100 and controls multiple off-chip devices via reset, enable and other signals. SMU 180 manages one or more clock sources (not shown), such as a phase locked loop (PLL), to provide clock signals for each of the components of APU 100. SMU 180 also manages power for the various processors and other functional blocks, and may receive measured power consumption values from CPU cores 112 and 114 and graphics core 120 to determine appropriate power states. SMU communicates with various circuit blocks over SCF 193 for accomplishing system management, including a test block 184, a thermal monitoring block 185, a clock control circuit (CLK) 186, a fuse reading circuit 187, and a system management input/output (SMUIO) block 188. SMU 180 is also in communication with each PSM 115 in order to activate them to monitor conditions and report the results. SMU 180 may adjust the low end operating voltage (typically referred to as "Vmin" interchangeably with the actual Vmin that may be measured for semiconductor circuits) for the relevant voltage domain based on accessing a prediction model 182 providing a predicted safe low end operating voltage based on the results obtained from a PSM 115, as further described below. SMU 180 also implements various system monitoring and power saving functions. For example, if APU 100 becomes hot, then SMU 180 can reduce the frequency and voltage of CPU cores 112 and 114. Thermal events can also be received from external sensors by SMU 180 via SCF 183, and SMU 180 can reduce the clock frequency and/or power supply voltage in response.

Peripheral controllers 160 include a universal serial bus (USB) controller 162 and a Serial Advanced Technology Attachment (SATA) interface controller 164, each of which is bidirectionally connected to a system hub 166 and to the SMN bus. These two controllers are merely exemplary of peripheral controllers that may be used in APU 100.

Peripheral Component Interconnect Express (PCIe) controller 174 and USB controller 162 are bidirectionally connected to an input/output (I/O) hub 176. PCIe controller includes a multiplexer/demultiplexer (MUS/DEMUX) adapted to route traffic to various PCIe PHY's. USB controller 162 is connected to plurality of USB PHYs. I/O hub 176 is bidirectionally connected to system hub 166 and to SDF 125. Thus, for example, a CPU core can program registers in USB controller 162, PCIe controller 174, or various other controllers (not shown), with accesses passing through SDF 125 routes and I/O hub 176. Software and firmware for APU 100 are stored in a system data drive or system BIOS memory (not shown) which can be any of a variety of non-volatile memory types, such as read-only memory (ROM), flash electrically erasable programmable ROM (EEPROM), and the like. Typically, the BIOS memory is accessed through the PCIe bus, and the system data drive through a SATA interface.

Each of UMCs 141 and 142 are connected to SDF 125. UMCs 141 and 142 are connected to memory physical layer interfaces (PHYs) 151 and 152 can connect to state-of-the-art DDR memories such as DDR version four (DDR4), low power DDR4 (LPDDR4), graphics DDR version five (GDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
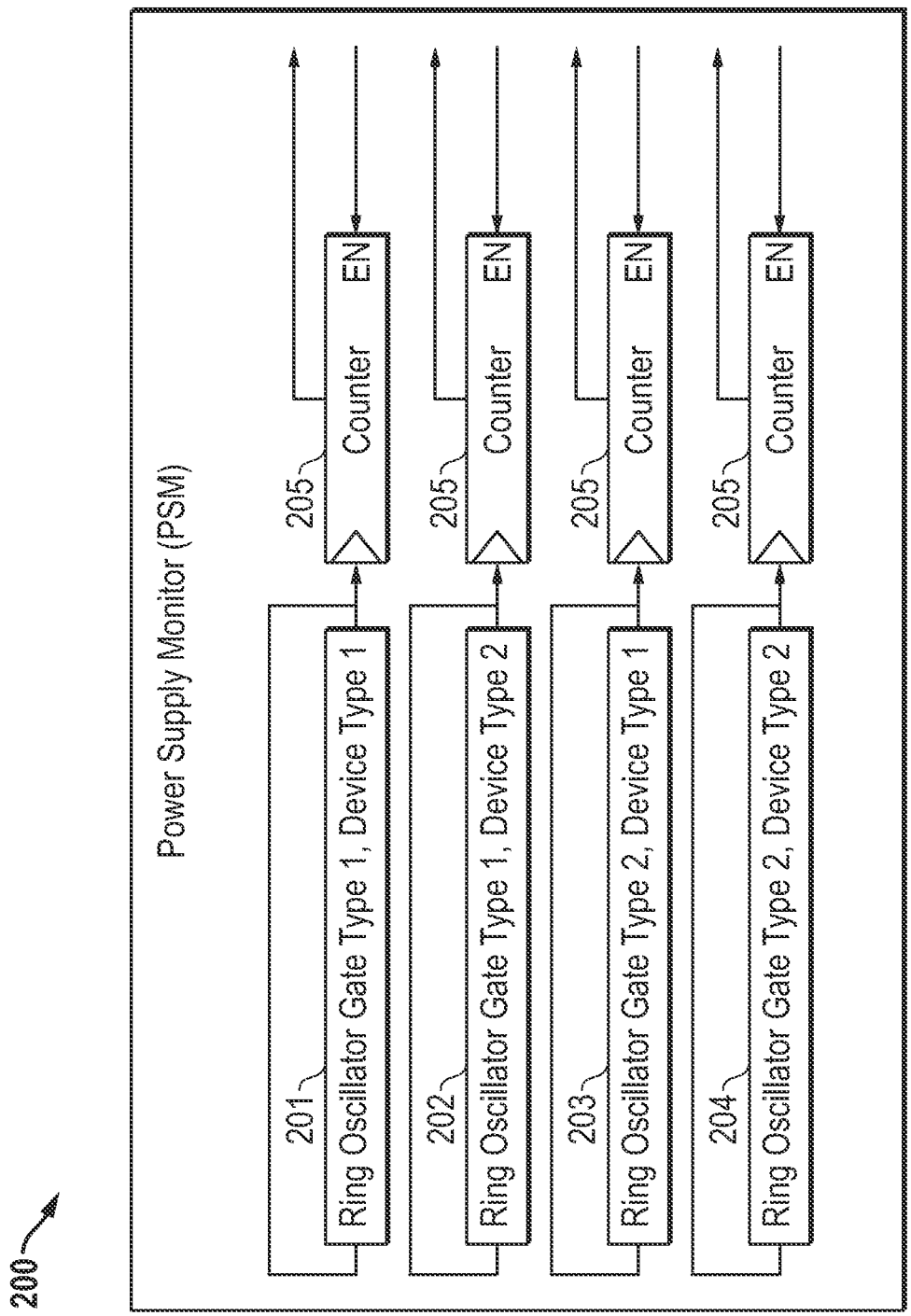
FIG. 2 illustrates in block diagram form a power supply monitor (PSM) suitable for use in the APU of FIG. 1 according to some embodiments.

FIG. 2 illustrates in block diagram form a power supply monitor (PSM) 200 suitable for use in APU 100 of FIG. 1. Generally, PSM 200 includes a number of ring oscillators 201-204, each connected to a respective counter 205 for counting oscillations from the ring oscillator. An enable signal EN is enables the counters for a designated period measured by the system reference clock. The counter values may also be averaged or otherwise combined with other digital logic, not shown.

Each of ring oscillators 201-204 includes a series of logic gates configured to oscillate with a feedback connection from the end of the series to the beginning. While at a minimum only one ring oscillator is needed, a preferred embodiment uses multiple oscillators constructed with different logic gates and different device (transistor) types in order to characterize the degradation of devices in APU 100 over its operating life. The depicted arrangement is provided to show examples of how different oscillators are used. As shown, ring oscillator 201 is constructed of a first type of logic gate and a first type of device, while ring oscillator 202 uses the first type of logic gate but a second type of device. The logic gate type is selected from various types such as inverters, NAND gates, NOR gates, D-type flip-flops, or other common logic gates employed within CPU core complex 110. The device type is selected from various transistor types or sizes that may be employed within CPU core complex 110. For example, high voltage threshold (Vt) devices and low Vt devices of the same transistor may be used. Different sizes and transistor designs may also be used. As shown, various combinations of gate type and device type may be used, with ring oscillator 203 using a second gate type with the first device type, and ring oscillator 204 using the second gate type with the second device type. The combinations of gate type and device type are selected to characterize the degradation that occurs over time causing an increase in the shifts/increases over time as the chip gets used/stressed because of known effects like HCI (Hot Carrier Injection), BTI (Bias Temperature Instability) and others Counters 205 may be implemented with any suitable counter design such as a ripple counter including a series of edge triggered latches and operates on a reference clock signal. In operation, PSM 200 is controlled by SMU 180

(FIG. 1) to enable ring oscillators 201-204 and counters 205 for a designated period of time as measured by a reference clock such as the system clock. Counters 205 count the number of oscillations of a corresponding ring oscillator over a predetermined time period, providing an indication of how much the speed of the corresponding ring oscillator varies as the various gate and device types degrade over time. The resulting values can be reported directly to SMU 180, or can be averaged or otherwise manipulated by digital logic circuitry before reporting.

Figure 3:
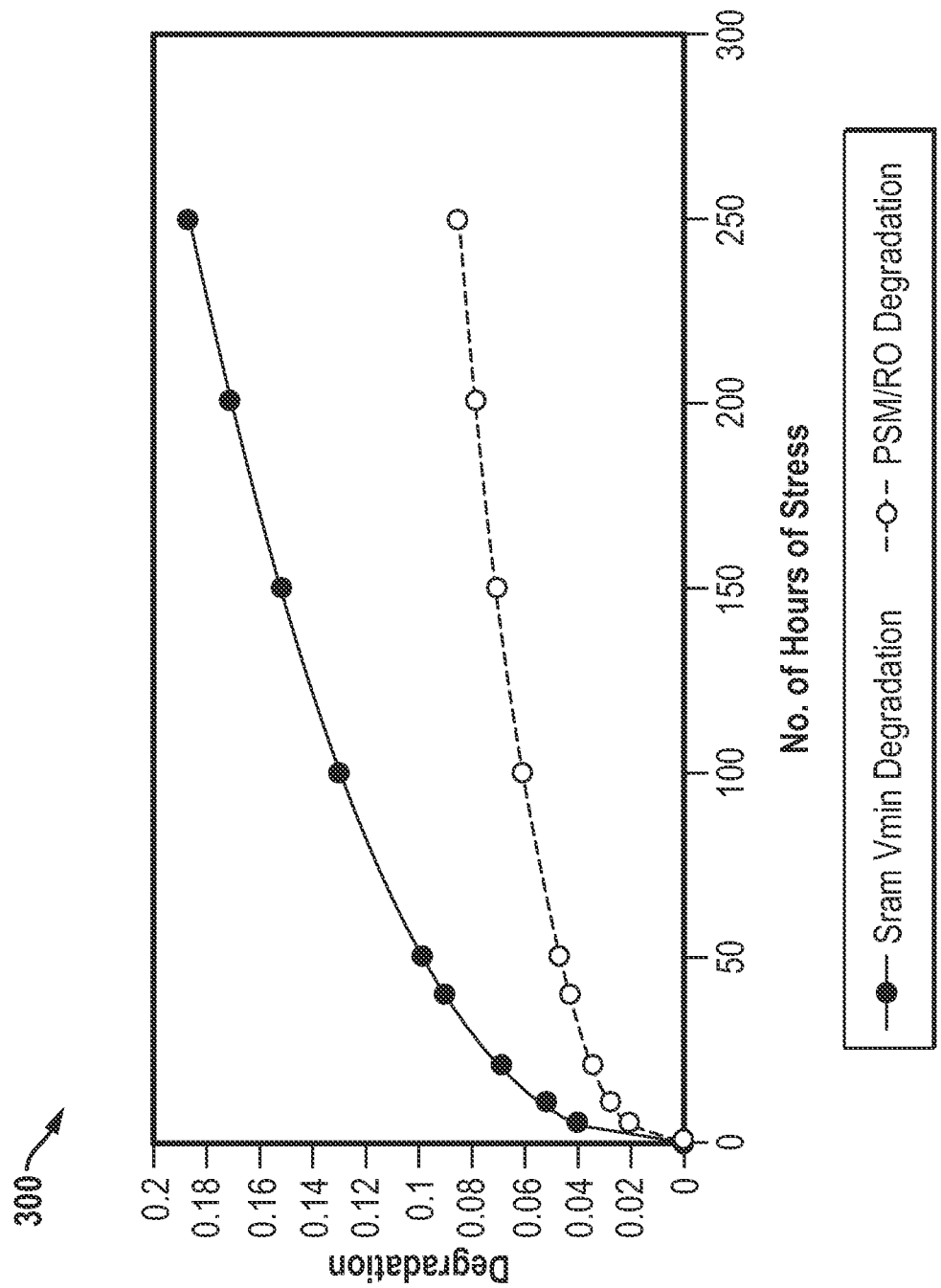
FIG. 3 is a chart showing example degradation data obtained during High Temperature Operating Life (HTOL) stress testing of a set of integrated circuits.

FIG. 3 is a chart 300 showing example degradation data obtained during High Temperature Operating Life (HTOL) stress testing of a set of integrated circuits. The testing process is described below with regard to FIG. 4. On chart 300, the vertical axis shows the degradation as a magnitude of the Vmin increase, and the horizontal axis shows the number of hours of HTOL stress testing. A first graph is plotted showing Vmin degradation for SRAM on the integrated circuit. A second graph is plotted showing degradation for PSM circuits including ring oscillators, indicating how much additional voltage is required to obtain a designated ring oscillator frequency/count as the ring oscillators degrade over time. As described below, in the voltage calibration process herein, using ring oscillator circuits like those of PSM 200, the ring oscillator speed is measured by counting to identify a speed associated with each degradation point. The ring oscillator degradation relates to the SRAM degradation as shown on the chart, enabling the run-time calibration process as described below to predict a current level of degradation and identify a low-end operating voltage for the SRAM.

Figure 4:
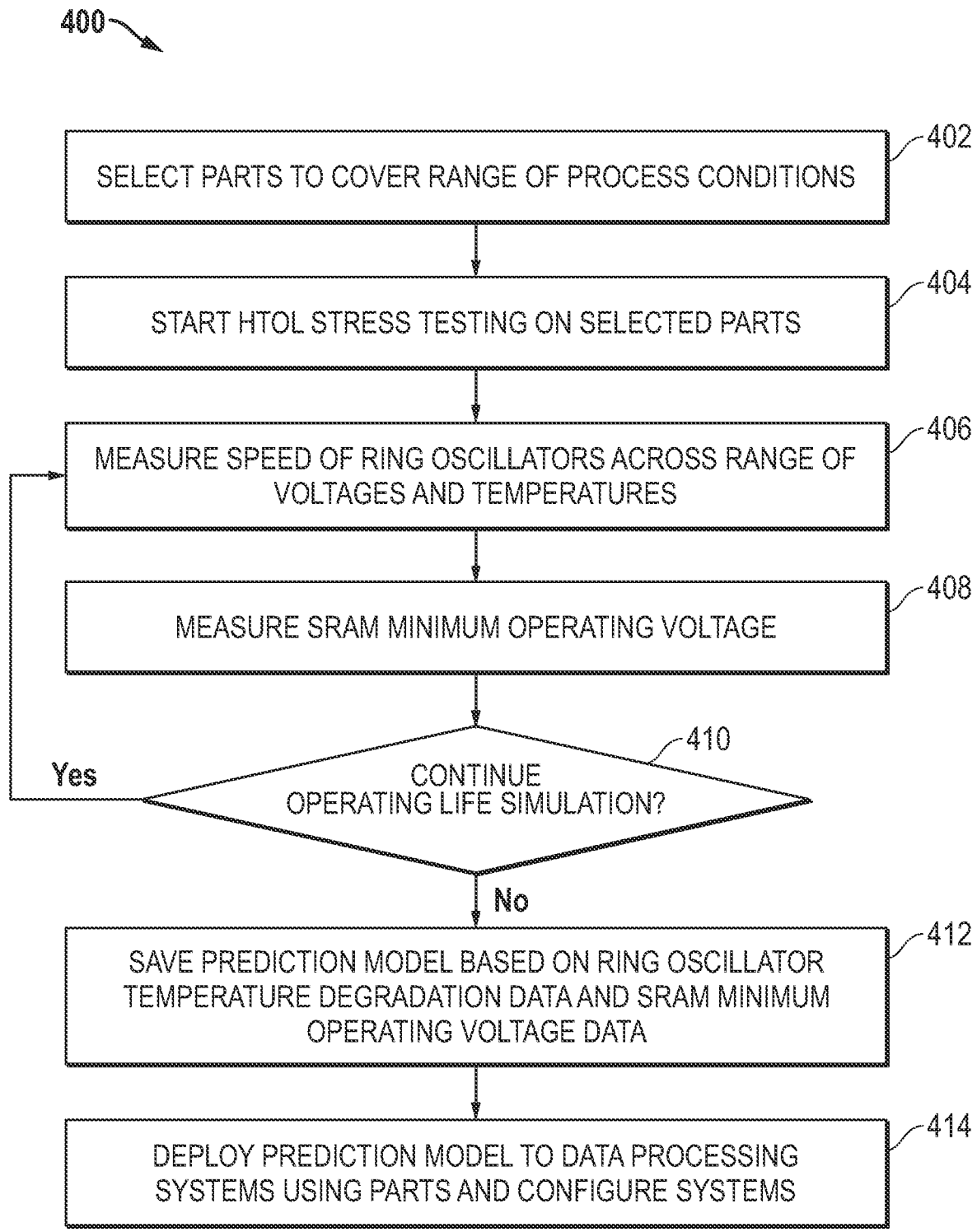
FIG. 4 is a flow chart of a process of configuring a low end operating voltage control process for a target integrated circuit according to some embodiments.

FIG. 4 is a flow chart 400 of a process of configuring a low end operating voltage control process for a target integrated circuit according to some embodiments. The process may be performed, for example, under control of SMU 180 (FIG. 1) accessing PSM circuits like PSM 200 of FIG. 2.

The process begins at block 402 where parts are to cover range of process conditions. The parts selected typically include "corner" parts, which include various characteristics produced by semiconductor manufacturing at the end of the range of allowed variations. Typical parts, i.e. those in the center of the variation ranges, can also be included. The parts tested are of the same model or design as the target integrated circuit for which an operating life prediction model will be deployed as further described below.

At block 404, the process begins performing HTOL stress testing. HTOL stress testing is a manner of simulating degradation that occurs over the expected operating life of an integrated circuit (e.g., 2 years or more) by stressing the integrated circuit with elevated temperature, high voltage and dynamic operation for a predefined period of time, typically in the hundreds of hours as shown in the chart of FIG. 3.

During the HTOL testing, the process at block 406 measures the speed of ring oscillator circuits across a range of voltages and temperatures. This measurement is done periodically throughout the HTOL testing as indicated by the loop in flow chart 400. The range of voltages used includes operating voltages low enough to determine a low end operating voltage (Vmin) for various temperatures across the simulated lifetime of the integrated circuit. The low end voltage may be identified in any suitable way such as identifying the voltage at which the ring oscillator slows below an acceptable speed. In this embodiment, the speed measurement is done by counting oscillations for a designated period of time measured by a clock speed. Such a count is obtained at the conditions for low end operating voltage measured in the testing, and at higher voltages to enable identifying the amount of degradation using a count while operating at a higher voltage.

At block 408, which is also repeated during the HTOL testing, the process measures minimum operating voltage for SRAM memory circuits within the integrated circuit. This measurement identifies a low end operating voltage for the memory, which may be determined in any suitable way, such as by lowering the voltage until errors are found, lowering the voltage until the memory slows below an acceptable speed, or measuring other characteristics of the memory at various voltage increments. The resulting data from block 408 is saved as a second set of SRAM low end operating voltage data.

As shown at block 410, the process repeats blocks 406 and 408 multiple times over the course of HTOL testing to obtain degradation data like that of FIG. 3 spanning the simulated lifetime of the integrated circuits. A prediction model is created at block 412 based on this data. In this embodiment, the prediction model includes ring oscillator speed data in the form of count values, and data associated with the measurements at blocks 406 and 408 allowing a predicted level of degradation to be identified based on counting oscillations of ring oscillators. The predicted level of degradation is preferably stored as desired low end operating voltage associated with each data point of speed data. In other embodiments, a mathematical model may be employed relating the measured speed data or ring oscillator count as an input, and a low end operating voltage limit as an output. In those embodiments, block 412 includes curve matching the data to create a mathematical equation or model to associate the SRAM degradation data (FIG. 3) with measured ring oscillator speeds.

At block 414, the prediction model is deployed to data processing systems which include the integrated circuit design for which the HTOL testing was performed. The prediction model data is saved to the system, typically in non-volatile memory accessible by the systems management controller such as SMU 180. The SMU is configured with software or firmware to make low end operating voltage adjustments during the lifetime of the integrated chip.

Figure 5:
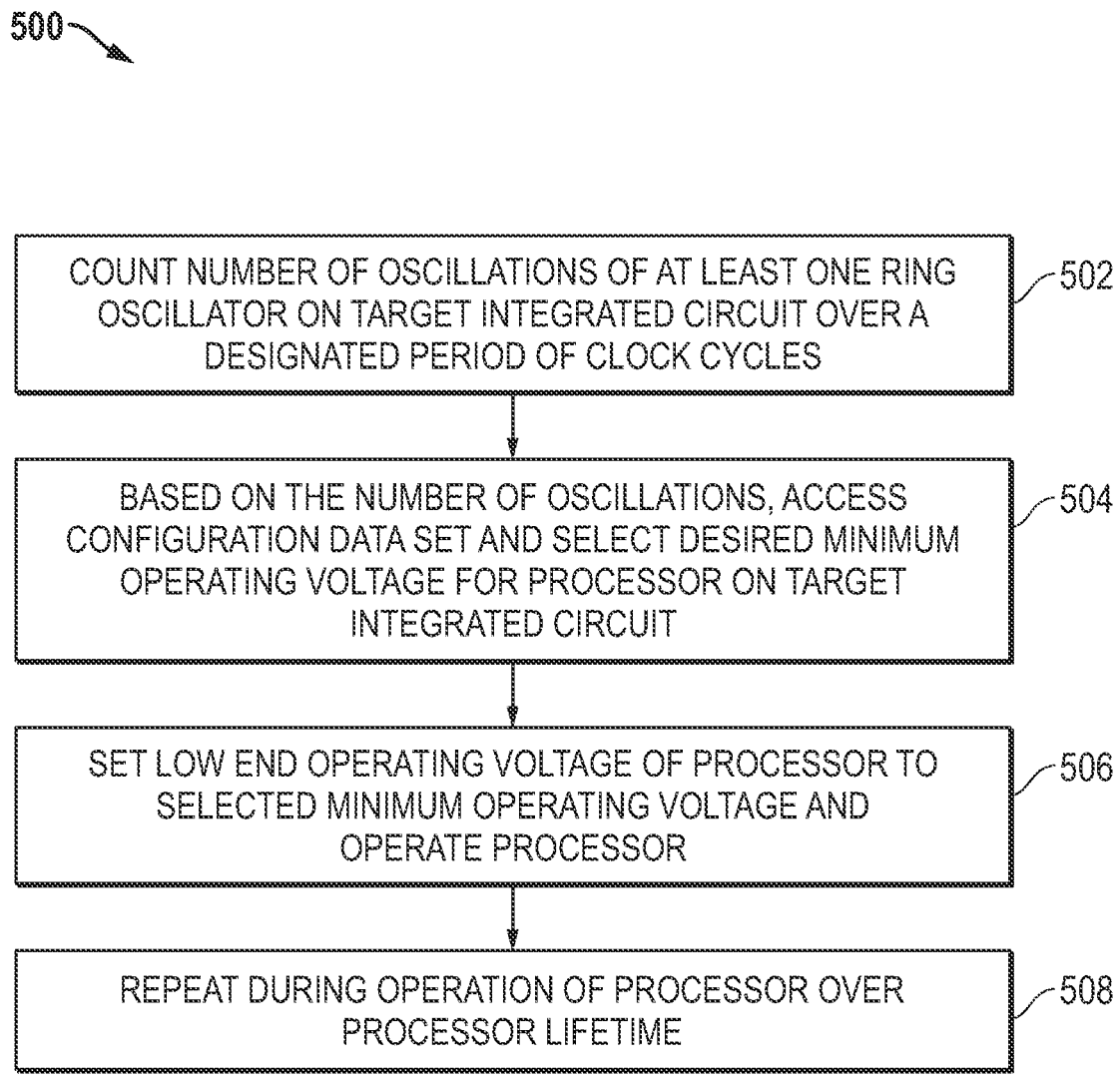
FIG. 5 is a flowchart of a process for adjusting a low end operating voltage of an integrated circuit according to some embodiments.

FIG. 5 is a flowchart 500 of a process for adjusting a low end operating voltage of an integrated circuit. In this embodiment, the process is conducted during the "mission mode" or deployed operation of the integrated circuit, and managed by a system management processor such as SMU 180 under control of firmware. Other embodiments may control the process with suitable digital circuitry.

The process begins at block 502 where it count a number of oscillations of at least one ring oscillator on the target integrated circuit over a designated period of clock cycles. As described above, the counting may be performed for more than one ring oscillator, including ring oscillators with different gate types and different device types as described with respect to FIG. 2. In this embodiment, the counting is performed by enabling a PSM circuit including ring oscillators and receiving resulting count values from counters such as counters 205 connected to the ring oscillators.

At block 504, based on the number of oscillations, the process accesses the prediction model and selects from the model a low end operating voltage for a processor on the target integrated circuit.

At block 506, the process sets the low end operating voltage of the processor based on the selected low end operating voltage and then operates the processor. Such a voltage adjustment may be performed for other circuits besides a processor, and for multiple voltage domains in which SRAM is present. For example, if SDF 125 operates with a separate voltage domain, a separate adjustment may be made for that domain. Furthermore, the process sets a voltage that is the low end or Vmin operating voltage, but the processor may of course vary the operating voltage to be higher than the minimum during operation based on performance requirements and other relevant conditions such as temperature.

At block 508, the process repeats blocks 502 through 506 multiple times during operation of the data processing system. For example, the blocks can be repeated at boot time, and at selected intervals during operation after the host data processing system has booted or reset.

APU 100 of FIG. 1 or any portions thereof, such as SMU 180, may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

As can be understood from this disclosure, the techniques described above provide a mission mode calibration cycle to dynamically determine the right amount of Vmin compensation to be added at any desired time during usage of the chip, depending on the actual usage conditions and degradation of each given chip. This greatly improves power efficiency at Vmin-limited operation for most of the lifetime of most parts.

The techniques herein may be used, in various embodiments, with any suitable systems that employ large memory expansion modules, for example, media servers and data processing platforms. Further, the techniques are broadly applicable for use with processors implemented with CPUs and acceleration processors, including memory-centric architectures, in which memory expansion devices are connected to processors over a high-speed bus or communication link.

While particular embodiments have been described, various modifications to these embodiments will be apparent to those skilled in the art. For example, the prediction model may include data obtained from the testing described in FIG. 4, or may include a mathematical model based on the results of such testing, the mathematical model mapping a speed measurement of an oscillator to a predicted Vmin of SRAM circuitry. Accordingly, it is intended by the appended claims to cover all modifications of the disclosed embodiments that fall within the scope of the disclosed embodiments.

What is claimed is:

1. A method of configuring a low end operating voltage control process for a target integrated circuit, the method comprising:

performing High Temperature Operating Life (HTOL) stress testing of a set of integrated circuits of the same model as the target integrated circuit and saving a resulting first set of device degradation data;

measuring low end operating voltages of static random-access memory (SRAM) on the set of integrated circuits during the HTOL stress testing and saving a resulting second set of SRAM low end operating voltage data;

producing a prediction model associated with the first set of device degradation data and the second set of SRAM low end operating voltage data;

deploying the prediction model to a data processing system including the target integrated circuit and configuring the target integrated circuit to:
 (a) count a number of oscillations of at least one ring oscillator on the target integrated circuit over a designated period of clock cycles;
 (b) based on the number of oscillations, access the prediction model and select from the prediction model a low end operating voltage limit for a processor on the target integrated circuit;
 (c) set the low end operating voltage of the processor based on the low end operating voltage limit; and
 (d) repeat paragraphs (a)-(c) multiple times during operation of the data processing system.

2. The method of claim 1, wherein the HTOL stress testing includes counting oscillations of at least one ring oscillator on each of the set of integrated circuits under varied temperature, voltage, and age conditions.

3. The method of claim 1, wherein the HTOL stress testing includes counting oscillations at a plurality of ring oscillators positioned in different areas on each of the set of integrated circuits under varied temperature, voltage, and age conditions.

4. The method of claim 3, wherein the plurality of ring oscillators includes a first ring oscillator comprising a first a series of logic gates, and a second ring oscillator comprising a series of different logic gates than the first series.

5. The method of claim 3, wherein the plurality of ring oscillators includes a first ring oscillator comprising a first a series of logic gates constructed with transistors of a first type, and a second ring oscillator comprising a series of logic gates constructed with transistors of a second type different from the first type.

6. A method of adjusting a low end operating voltage of an integrated circuit comprising:
 (a) counting a number of oscillations of at least one ring oscillator on the integrated circuit over a designated period of clock cycles;
 (b) based on the number of oscillations, accessing a prediction model associated with a first set of device degradation data and a second set of static random-access memory (SRAM) low end operating voltage data, and selecting from the prediction model a low end operating voltage limit for a processor on the integrated circuit;
 (c) setting the low end operating voltage of the processor based on the low end operating voltage limit; and
 (d) repeating paragraphs (a)-(c) multiple times during operation of the processor.

7. The method of claim 6 wherein counting a number of oscillations of at least one ring oscillator further comprises counting oscillations at a plurality of ring oscillators positioned in different portions of the integrated circuit.

8. The method of claim 7, wherein counting a number of oscillations of at least one ring oscillator further comprises counting oscillations at a first ring oscillator comprising a first series of logic gates, and counting oscillations at a second ring oscillator comprising a series of different logic gates from the first series.

9. The method of claim 7, wherein counting a number of oscillations of at least one ring oscillator further comprises counting oscillations at a first ring oscillator comprising a first a series of logic gates constructed with transistors of a first type, and at a second ring oscillator comprising a series of logic gates constructed with transistors of a second type different from the first type.

10. The method of claim 6, wherein accessing the prediction model includes accessing the first set of device degradation data.

11. The method of claim 6, wherein accessing the prediction model includes accessing the second set of SRAM low end voltage data.

12. The method of claim 6, wherein accessing the prediction model includes first accessing the first set of device degradation data, and based on a result obtained therefrom, accessing the second set of SRAM low end voltage data.

13. The method of claim 6, wherein the first set of device degradation data is provided from High Temperature Operating Life (HTOL) stress testing of a set of integrated circuits of the same design as the integrated circuit.

14. The method of claim 13, wherein the second set of SRAM low end operating voltage data is provided from measuring low end operating voltages of SRAM memory on the set of integrated circuits during the HTOL stress testing.

15. An integrated circuit comprising:
a processor core;
a system management unit which sets a voltage level on which the processor core operates, the system management unit operable to adjust a low end operating voltage of the processor core by:
(a) obtaining a count of oscillations of at least one ring oscillator on the integrated circuit over a designated period of clock cycles;
(b) based on the count, accessing a prediction model associated with a first set of device degradation data and a second set of static random-access memory (SRAM) low end operating voltage data, and selecting from the model a low end operating voltage limit for the processor core;
(c) setting the low end operating voltage of the processor core based on the low end operating voltage limit; and
(d) repeating paragraphs (a)-(c) multiple times during operation of the integrated circuit.

16. The integrated circuit of claim 15, wherein the at least one ring oscillator comprises a plurality of ring oscillators positioned in different portions of the integrated circuit.

17. The integrated circuit of claim 16, wherein the plurality of ring oscillators includes a first ring oscillator comprising a first a series of logic gates, and a second ring oscillator comprising a series of different logic gates than the first series.

18. The integrated circuit of claim 16, wherein the plurality of ring oscillators includes a first ring oscillator comprising a first a series of logic gates constructed with transistors of a first type, and a second ring oscillator comprising a series of logic gates constructed with transistors of a second type different from the first type.

19. The integrated circuit of claim 15, wherein accessing the prediction model includes accessing the first set of device degradation data.

20. The integrated circuit of claim 15, wherein accessing the prediction model includes accessing the second set of SRAM low end voltage data.

21. The integrated circuit of claim 15, wherein accessing the prediction model includes first accessing the first set of device degradation data, and based on a result obtained therefrom, accessing the second set of SRAM low end voltage data.

22. The integrated circuit of claim 15, wherein the first set of device degradation data is provided from High Temperature Operating Life (HTOL) stress testing of a set of integrated circuits of the same design as the integrated circuit.

23. The integrated circuit of claim 22, wherein the second set of SRAM low end operating voltage data is provided from measuring low end operating voltages of SRAM memory on the set of integrated circuits during the HTOL stress testing.

* * * * *